United States Patent
Schierling et al.

(10) Patent No.: US 11,075,623 B2
(45) Date of Patent: Jul. 27, 2021

(54) METHOD FOR CONTROLLING A DIRECT CURRENT SWITCH, DIRECT CURRENT SWITCH, AND DC VOLTAGE SYSTEM

(71) Applicant: SIEMENS AKTIENGESELLSCHAFT, Munich (DE)

(72) Inventors: Hubert Schierling, Erlangen (DE); Peter Kaluza, Rieden (DE); Benno Weis, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 46 days.

(21) Appl. No.: 16/495,917

(22) PCT Filed: Mar. 13, 2018

(86) PCT No.: PCT/EP2018/056173
§ 371 (c)(1),
(2) Date: Sep. 20, 2019

(87) PCT Pub. No.: WO2018/172134
PCT Pub. Date: Sep. 27, 2018

(65) Prior Publication Data
US 2020/0136604 A1 Apr. 30, 2020

(30) Foreign Application Priority Data
Mar. 23, 2017 (EP) ..................... 17162606

(51) Int. Cl.
*H03K 17/0812* (2006.01)
(52) U.S. Cl.
CPC .................. *H03K 17/08128* (2013.01); *H03K 2217/0081* (2013.01)

(58) Field of Classification Search
USPC ......................................................... 307/115
See application file for complete search history.

(56) References Cited

U.S. PATENT DOCUMENTS

| 5,635,821 A | * | 6/1997 | Smith | ................... H02J 7/0031 320/103 |
| 2011/0133571 A1 | * | 6/2011 | Kiyohara | .............. H01M 10/48 307/130 |

(Continued)

FOREIGN PATENT DOCUMENTS

| DE | 10 2013 009 991 A1 | 12/2014 |
| DE | 102013009991 | * 12/2014 |

(Continued)

OTHER PUBLICATIONS

PCT International Search Report and Written Opinion of International Searching Authority dated Jun. 27, 2018 corresponding to PCT International Application No. PCT/EP2018/058173 filed Mar. 13, 2018.

*Primary Examiner* — Rexford N Barnie
*Assistant Examiner* — Xuan Ly
(74) *Attorney, Agent, or Firm* — Henry M. Feiereisen LLC

(57) ABSTRACT

In a method for controlling a direct current switch having first and second semiconductor switches capable of being switched off, the first and second semiconductor switches are arranged between first and second terminals to enable conduction of a current with a first polarity through the first semiconductor switch and conduction of the current with a second polarity that is opposite to the first polarity through the second semiconductor switch. One of the first and second semiconductor switches is switched off as a function of a current measurement value.

19 Claims, 2 Drawing Sheets

(56) References Cited

U.S. PATENT DOCUMENTS

2011/0133817 A1* 6/2011 Brueckl .................. H01F 29/04
327/482
2017/0285674 A1 10/2017 Deboy

FOREIGN PATENT DOCUMENTS

DE   10 2016 100 776 A1   7/2016
DE   10 2015 011 396 A1   3/2017

* cited by examiner

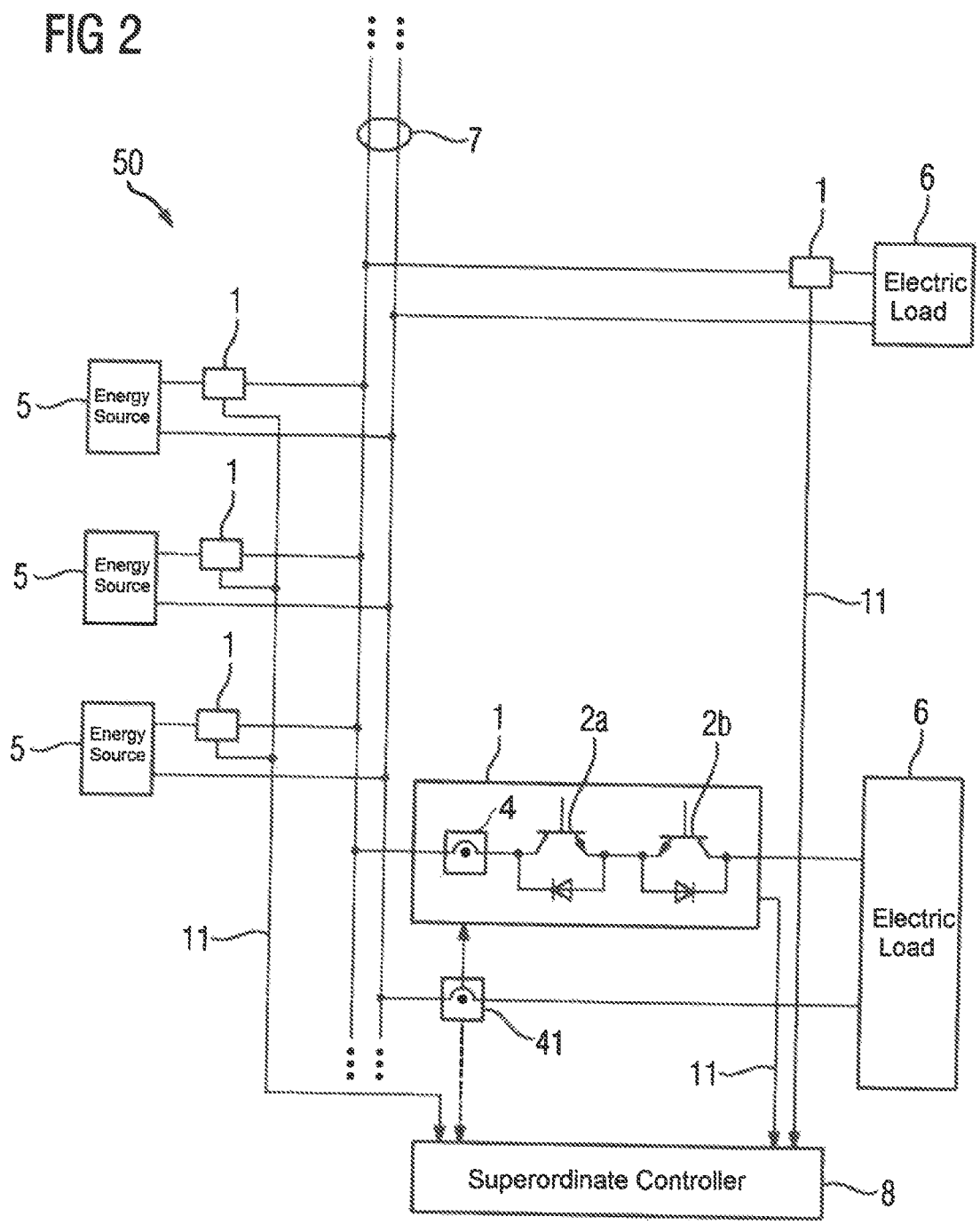

METHOD FOR CONTROLLING A DIRECT CURRENT SWITCH, DIRECT CURRENT SWITCH, AND DC VOLTAGE SYSTEM

CROSS-REFERENCES TO RELATED APPLICATIONS

This application is the U.S. National Stage of International Application No. PCT/EP2018/056173, filed Mar. 13, 2018, which designated the United States and has been published as International Publication No, WO 2018/172134 A1 and which claims the priority of European Patent Application, Serial No, 17162606.2, filed Mar. 23, 2017, pursuant to 35 U.S.C. 119(a)-(d).

BACKGROUND OF THE INVENTION

The invention relates to a method for controlling a direct current switch. The invention further relates to a direct current switch and a DC voltage system.

Direct current switches are needed in order to be able to switch a direct current. Unlike switching alternating current switches, these are significantly more complex in structure, since in direct current operation, which for example predominates in DC voltage systems, the current does not have a zero crossing at which quenching of the current can be readily implemented.

Direct current switches presently on the market are hence comparatively expensive. Furthermore, they are often not short-circuit-proof. Because of the way they work they are furthermore large and heavy and thus it is a complex matter to integrate them into energy supply systems or drive systems.

A circuit-breaker is used to switch off electric circuits, conductors or individual loads when the permissible current values or voltage values are exceeded. This applies for example both to an overcurrent and to a fault current. A fault current switch is a switch which opens when an outward and a return current differ by a set amount.

The object underlying the invention is to improve a direct current switch and the controller thereof.

SUMMARY OF THE INVENTION

This object is achieved by a method for controlling a direct current switch, wherein the direct current switch has a first semiconductor switch which can be switched off and a second semiconductor switch which can be switched off, wherein the first and the second semiconductor switches are arranged between a first terminal and a second terminal such that a current with a first polarity can be conducted through the first semiconductor switch and the current with a polarity that is opposite to the first polarity can be conducted through the second semiconductor switch, wherein one of the semiconductor switches is switched off as a function of a current measurement value. The object is further achieved by a direct current switch having a first and a second semiconductor switch which can be switched off and a local control device for performing such a method, wherein the first and the second semiconductor switches are arranged between a first terminal and a second terminal such that a current with a first polarity can be conducted through the first semiconductor switch and the current with a polarity that is opposite to the first polarity can be conducted through the second semiconductor switch, wherein by means of the local control device the current through the direct current switch can be switched off as a function of a current measurement value by switching off one of the semiconductor switches. The object is further achieved by a DC voltage system having at least one energy source with a DC voltage, at least one electric load with a DC voltage terminal and at least one such direct current switch.

Further advantageous embodiments of the invention are set out in the dependent claims.

The invention is based on the knowledge that a mechanical DC switch is substituted by an electronic switch, preferably a transistor. Since this must switch off a current, a semiconductor switch which can be switched off is used. If the direction of the current and/or voltage reverses, for example in the event of recuperation, the semiconductor which can be switched off is frequently provided with an antiparallel diode which then conducts the current in the opposite direction. In this case the current can then only be switched off independently of its current flow direction, also called polarity, if a second semiconductor switch which can be switched off is deployed antiserially to the first switch. Antiserially in this context means that the second semiconductor switch is arranged in series to the first semiconductor switch, but can conduct a current in the other direction, in other words with an opposite polarity. This too is operated with an inverse diode, in order to enable operation of the direct current switch for both polarities. Alternatively, reverse-blocking IBGTs can also be used in antiparallel switching. In this case both reverse-blocking IBGTs are arranged in a parallel circuit and are aligned such that the first semiconductor switch can conduct the current with a first polarity and the second semiconductor switch can conduct the current with an opposite polarity. Besides reverse-blocking IBGTs, any other reverse-blocking semiconductor switches can also be arranged in an antiparallel circuit.

Alternatively it has proved to be advantageous with the antiserial arrangement if the antiparallel diode is integrated in the chip of the transistor. Such a switch is also called a reverse-conducting switch. It is further possible, in the case of a MOSFET or JFET, to operate the channel in both current directions (antiparallel arrangement).

With this switch arrangement it is possible to switch direct currents in addition to alternating currents. A particular advantage is that unlike mechanical switches, no arc can form inside the switch, said arc having to be quenched, i.e. eliminated. In this case the inventive direct current switch additionally offers the option of interrupting the current in just one direction. To this end precisely one of the semiconductor switches which can be switched off is then switched off. Thus an electric load can be isolated from the system for power consumption, for example if as a result there is a risk of an overload. At the same time the recovery of energy, for example of a drive, can still be enabled, since the current direction reverses in this case, i.e. the polarity of the current changes. Thus the electric load can continue to supply stored energy, even if the consumption of energy has been interrupted by means of the direct current switch. This is possible because of the two semiconductor switches which can be switched off.

The energy recovery which continues to be possible increases the environmental sustainability of the system and helps to cut (energy) costs. In addition, dangerous states, for example for maintenance, can be prevented, since it is still possible with this direct current switch for the energy store located in the electric load to be discharged. Thus the energy store can be completely or at least virtually completely discharged prior to the start of maintenance work.

With AC voltage systems (single-phase or multi-phase) loads are frequently switched on and off using switches (=contactors). If a repair switch (=switch-disconnector) is required, it can be used instead of the switch. For short-circuit protection a short-circuit switching element (=circuit-breaker) is normally used upstream thereof. And for line protection and/or short-circuit protection of the load a blow-out fuse can also be used. When using the inventive direct current switch the concept for AC voltage systems can readily be transferred to direct current systems without change.

In an advantageous embodiment of the invention one of the semiconductor switches is switched off in a fault situation. As soon as a fault situation is detected the direct current switch is switched off. The switch-off can in this case take place for just one current direction by switching off precisely one switch. Alternatively the switch-off can also take place for both current directions by switching off both semiconductor switches. The fault situation can for example be detected by a current which is above an operationally permissible value. A further option is for the rise rate of the current to be examined alternatively or additionally and for a fault to be inferred if a set value is exceeded. The rise rate of the current corresponds to the time derivation of the current.

In a further advantageous embodiment of the invention the switch-off of one of the semiconductor switches takes place as a function of the time derivation of the current measurement value. A fault situation can be detected as a function of the time derivation of the current measurement value because of an excessive current rise. This detection has the advantage of opening the direct current switch even before high current values are reached and preventing loading with high currents both for the load as well as for the direct current switch. Thus the semiconductor switches which can be switched off can in part actually be dimensioned significantly smaller and more cost-efficiently.

In a further advantageous embodiment of the invention the selection of the semiconductor switch to be switched off takes place as a function of the polarity of the current measurement value of the current, in this case it has proved to be advantageous to analyze the fault current, i.e. the current in the fault situation, in respect of its polarity. The information about the polarity requires just 1 bit, so that it can be transmitted particularly easily.

The sign of the detected fault current or of the voltage lets the local control device of the switch determine whether the fault has occurred on its load side or its system side. This is readily possible based on the polarity of the current. Depending on the polarity of the current, i.e. depending on the direction of the current, only the switch lying in the direction of the fault is then opened. Especially for a system-side fault which may have arisen through a fault in another load or in the energy supply device or one of the energy supply devices, this enables the load supplied by the direct current switch to continue to be operated free from interruption. System-side and load-side faults can be detected based on the polarity of the fault current, i.e. based on the polarity of the current in a fault situation. This can readily be detected based on the sign of the current measurement value.

In a further advantageous embodiment of the invention the switch-off for a first polarity takes place at a first limit value and for a polarity opposite to the first polarity at a second limit value, wherein the first limit value is at least 25% greater in size than the second limit value. It has proved advantageous if the trigger threshold of the direct current switch for system-side fault currents is set higher than the trigger threshold of the switch for load-side fault currents. A difference of at least 25%, in particular monitoring for a 30% higher fault current, means that for a fault in a load the immediately upstream switch, in other words the direct current switch at the associated load, preferably triggers, resulting in a natural and desired selectivity.

In a further advantageous embodiment of the invention a short-circuit is detected by means of $U_{CE}$ monitoring and is switched off by the local control device, which is provided for triggering the first and the second semiconductor switches, in particular independently of a superordinate controller. The direct current switch with its antiparallel semiconductor switches is combined with $U_{CE}$ monitoring already known from inverter circuits, which in the case of a short-circuit current can switch this off automatically within a few μs, without a superordinate controller having to be present. The $U_{CE}$ monitoring in this case acts on the semiconductor switch of the direct current switch at which a predefined voltage level has been exceeded. In the case of a system-side fault which may have arisen through a fault in another load or in the energy source, this enables the load supplied by the switch to continue to be operated free from interruption.

In a further advantageous embodiment of the invention the load on the respective semiconductor switch is determined by formation of an $i*t$ value or $i^2*t$ value, wherein the respective semiconductor switch is switched off if a load limit value is exceeded. The semiconductor switches of the direct current switch are each fitted with a current measurement device which is thus able to register currents which are slowly rising and/or are permanently above the rated value and in accordance with an $i*t$ or $i^2*1$ model or with another algorithm for determining the semiconductor load to switch off any overcurrent which would represent an impermissible load, in particular an impermissibly high thermal load of the semiconductor and of the supply leads. Slowly rising overloads of the load can thereby be registered. The evaluation can take place in the electronics system of the switch itself or by the local control device. In the first case the trigger threshold can be set or parameterized. If this current measurement device can detect short-circuit currents very fast (preferably within a few μs, in particular less than 10 μs), $U_{CE}$ monitoring can be dispensed with.

In a further advantageous embodiment of the invention a difference is formed between the current measurement value and a further current measurement value, wherein the further current measurement value is registered at a point at which a return current associated with the current measurement value is assumed, wherein when the amount of the difference is exceeded at least one of the semiconductor switches is switched off. Switches for both DC busbars which are triggered together or separately can be arranged in a branch to an electric load which is protected by the direct current switch. In this arrangement the current difference can be determined in both busbars. The difference can in this case be reported to a superordinate controller, for example for diagnostic purposes. Thus fault current protection can be readily implemented, without the need for further elements such as an ELCB circuit-breaker, for example.

In a further advantageous embodiment of the invention, the difference is formed frequency-selectively, in particular for frequencies below 1 kHz. It has proved to be advantageous if the local control device opens both semiconductor switches if the difference exceeds a predefined threshold of for example 300 mA. The measurement of the difference can be restricted as regards frequency range, for example to frequencies below 1 kHz, to prevent the direct current switch from being triggered in error.

In a further advantageous embodiment of the invention the direct current switch has a comparator for detecting the polarity of the current. With a comparator it is easy to determine whether the current has a positive or negative polarity. In other words, it is possible to detect the current direction by means of the comparator, by examining whether the current has a value greater than or less than zero. The comparator is a reliable component which is in particular suitable for use in safety-related applications. Unlike a software-aided analysis of the polarity of the current, the evidence of the reliable behavior is significantly easier to produce and to ensure.

In a further advantageous embodiment of the invention a protection element, in particular a switch-disconnector and/or a fuse, is arranged between the first terminal and one of the semiconductor switches. If on occasion, for example because of impermissibly high voltage peaks at the direct current switch, in particular at the electronic semiconductor switches which can be switched off, the latter cannot switch off in good time or malfunctions during the switch-off and a short-circuit current should nevertheless be safely switched off, a fuse element, also called a protection element, is connected upstream of the direct current switch. In a simple embodiment the protection element can be a fuse such as a blow-out fuse or a blasting fuse. The triggering of the fuse can be evaluated by the local control device of the direct current switch and reported to a superordinate controller.

Additionally or alternatively a switch-disconnector can be incorporated as a repair switch, which ensures that in the OFF position repair work can be carried out on the electric load. If the repair switch is activated, although the electronic switch is still switched on, the presence of an arc, both in the switch-disconnector and in the electric load, can be detected by registering and evaluating the high-frequency parts of the voltage signals and current signals, and then switched off with one of the semiconductor switches of the direct current switch. To this end the same current measurement device can be used as is also used for the detection of the polarity of the fault current. Thus this method is particularly cost-efficient, since there is no further hardware requirement for the current measurement.

The superordinate controller can switch the direct current switch on and off, for example via a bus. Likewise the status of the electronic switch (on, off, triggered, etc.) can be reported. Furthermore, the level of the voltages and/or the level of the current can be registered and evaluated: when registering the level of the voltages and/or of the currents at the individual serial switches it is possible to determine where an overload or a short-circuit has occurred and then to perform a selective switch-off. In this case the switch-off can advantageously be only in the direction where the fault has occurred.

In a further advantageous embodiment of the invention the local control device has an interface to a superordinate controller, wherein the semiconductor switches can be switched on and off by means of the superordinate controller. In this case at least one voltage value or current value of the direct current switch can be passed to a superordinate controller, preferably potential-free, via a bus. This voltage measurement opens up the possibility of being able to ensure selectivity in order to detect and characterize a fault reliably and to determine the location of said fault. In this case this transmitted information has, in the simplest case, only 1 bit (|U|>Umax) or 2 bits (U<-Umax or U>Umax). Alternatively or additionally the selectivity can be created by adjusting current/time characteristics in the electronics system of the switch.

BRIEF DESCRIPTION OF THE DRAWING

The invention is described and explained in more detail below on the basis of the exemplary embodiments shown in the figures. In the drawings:

FIG. 2 shows an energy supply system.

DETAILED DESCRIPTION OF PREFERRED EMBODIMENTS

Figure 1:
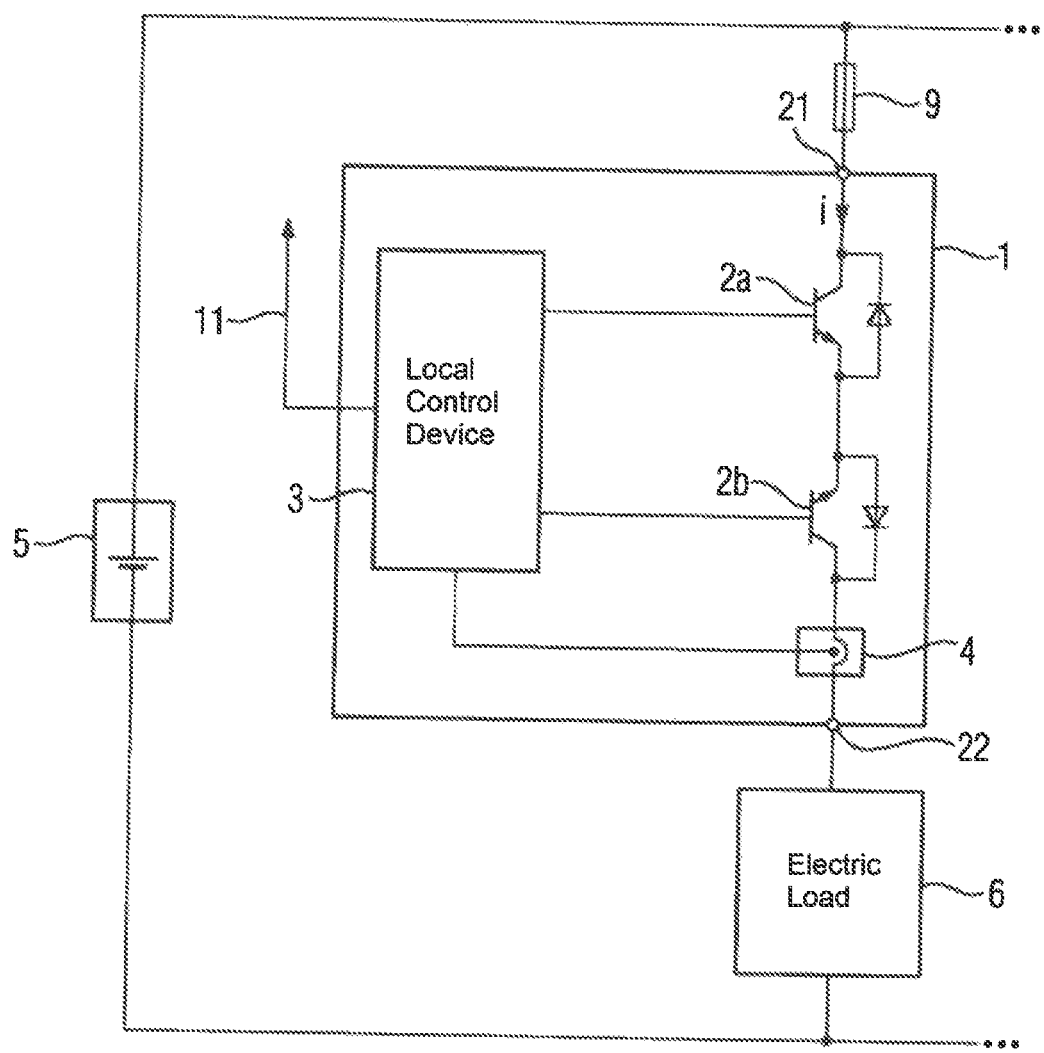
FIG. 1 shows a direct current switch, connected to an electric load and an energy source.

FIG 1 shows a direct current switch 1 which is connected to an energy source 5 and an electric load 6. The energy source 5 can be a generator, a photovoltaic system, an energy supply system or else an energy store, such as a battery for example. The direct current switch 1 serves to disconnect the electric load 6 from the energy source 5 and to switch off a current i. A current measurement device 4 is used to measure the current i and can be arranged inside the direct current switch 1 or outside the direct current switch 1. The semiconductor switches 2a, 2b which can be switched off are arranged antiserially between the first terminal 21 of the direct current switch 1 and the second terminal 22. This means that a current flow through the first semiconductor switch 2a flows through the diode which is antiparallel to the second semiconductor switch 2b. In the case of opposite polarity, i.e. a reverse current flow direction, the current flows through the second semiconductor switch 2b and through the diode which is antiparallel to the first semiconductor switch 2a. An antiparallel circuit of the two semiconductor switches 2a, 2b is not illustrated here. In this case diodes can be dispensed with, but the semiconductor switches must then be reverse-blockable.

The local control device 3, which is connected to the control terminals of the semiconductor switches 2a, 2b, serves to trigger the semiconductor switches 2a, 2b. The open-loop logic and/or closed-loop logic uses the signal from the current measurement device 4 as an input variable in this case. The interface 11 to the superordinate controller 8 serves here for the connection to a superordinate controller 8 (not shown here).

A fuse 9 can be integrated into the load branch as a further protection element and in the case of a high current load ensures the protection of the electric load 6, independently of the direct current switch 1, in particular independently of the local control device 3.

FIG. 2 shows a DC voltage system 50 which has a plurality of energy sources 5 and electric loads 6. For the avoidance of repetition, reference is made to the description relating to FIG. 1 and the reference characters therein. These components are connected to one another via a busbar 7. The busbar 7 in this case comprises an outward conductor and a return conductor, which serves to conduct the current to the electric load 6 (outward conductor) and back (return conductor) to the energy source 5. The individual energy sources 5 and the electric loads 6 are in each case disconnectably connected to the busbar 7 via one or, not shown here, multiple direct current switches 1. The energy transmission within the DC voltage system between the components takes place by means of DC voltage on the busbar 7. A DC voltage is present between the two conductors in this case.

At the lower electric load the option of fault current protection is to be explained in greater detail, so that some important components of the direct current switch 1 are illustrated more precisely. To create fault current protection another current measurement device 41 is present in the corresponding load path. The current measurement device 41 is arranged in one of the two conductors of the bulbar 7 and the corresponding other current measurement device 41 is arranged in the other conductor. Thus the outward current to the electric load 6 and the return current from said electric load 6 can be measured. If these currents are not identical, i.e. the difference is not equal to zero, it can be assumed that a fault current is present and the direct current switch opens its connection by means of at least one of the two semiconductor switches 2a, 2b which can be switched off. To this end the further current measurement device 41 can transmit the measured signal to the direct current switch 1. The local control device 3 (not shown here) evaluates this signal, for example by forming a difference with the signal of the current measurement device 4, and if required initiates the protection response, by setting said semiconductor switch into the blocking state by triggering at least one of the semiconductor switches 2a, 2b which can be switched off.

Likewise it is possible to carry out the fault current protection using a superordinate controller 8. In this case the signal of the further current measurement device 41 is also transmitted to the superordinate controller 8 in addition to the signal from the current measurement device 4, which takes place for example via a corresponding interface 11. The superordinate controller 8 can additionally monitor the operating state of the individual components (energy sources 5 and electric loads 6) from the signals from the individual direct current switches 1 and if required trigger a single direct current switch 1 or multiple direct current switches 1. Likewise it is possible to determine information from these about the status of the individual components in the direct current system 50.

To summarize, the invention relates to a method for controlling a direct current switch, wherein the direct current switch has a first semiconductor switch and a second semiconductor switch which can be switched off, wherein the first and the second semiconductor switches are arranged between a first terminal and a second terminal such that a current with a first polarity can be conducted through the first semiconductor switch and the current with a polarity that is opposite to the first polarity can be conducted through the second semiconductor switch, wherein one of the semiconductor switches is switched off as a function of a current measurement value. The invention further relates to a direct current switch having a first and a second semiconductor switch which can be switched off and a local control device for the performance of such a method. In addition the invention relates to a DC voltage system having at least one energy source with a DC voltage and at least one electric load with a DC voltage terminal and at least one such direct current switch

The invention claimed is:
1. A method for controlling direct current switch, in particular a fault current switch or a circuit-breaker, with the direct current switch having first and second semiconductor switches capable of being switched off, said method comprising:
arranging the first and second semiconductor switches between first and second terminals to enable conduction of a current with a first polarity through the first semiconductor switch and conduction of the current with a second polarity that is opposite to the first polarity through the second switch;
switching off one of the first and second semiconductor switches as a function of a current measurement value;
registering a further current measurement value at a point at which a return current associated with the current measurement value is assumed;
forming a difference between the current measurement value and the further current measurement value; and
switching off the one of the first and second semiconductor switches, when an amount of the difference is exceeded.

2. The method of claim 1, wherein the first and second semiconductor switches are arranged antiserially.

3. The method of claim 1, wherein the first and second semiconductor switches are arranged in an antiparallel circuit and are each embodied in particular as a reverse-blocking IGBT.

4. The method of claim 1, further comprising switching off one of the first and second semiconductor switches in a fault situation.

5. The method of claim 4, further comprising detecting the fault situation as a function of a time derivation of the current measurement value to switch off the one of the first and second semiconductor switches.

6. The method of claim 1, wherein precisely one of the first and second semiconductor switches is switched off.

7. The method of claim 1, wherein switching off the one of the first and second semiconductor switches is selected as a function of a polarity of the current measurement value of the current.

8. The method of claim 1, wherein switching off the one of the first and second semiconductor switches is implemented at a first limit value of the first polarity and at a second limit value of the second polarity, with the first limit value being greater than the second limit value by at least 25%.

9. The method of claim 1, further comprising:
detecting a short circuit by $U_{CE}$ monitoring; and
switching off the short circuit by a local control device configured to trigger the first and second semiconductor switches, in particular independently of a superordinate controller.

10. The method of claim 1, further comprising:
determining a of the first and second semiconductor switches by formation of an $i*t$ value or $i^2*t$ value; and
switching off the one of the first and second semiconductor switches, when a load limit value is exceeded.

11. The method of claim 1, wherein the difference is formed frequency-selectively, in particular for frequencies below 1 kHz.

12. A direct current switch, comprising:
first and second terminals;
first and second semiconductor switches capable of being switched off and arranged between the first and second terminals to enable conduction of a current with a first polarity through the first semiconductor switch and conduction of the current with a second polarity that is opposite to the first polarity through the second semiconductor switch;
a local control device configured to switch off the current through the direct current switch as a function of a current measurement value by switching off one of the first and second semiconductor switches; and a current measurement device configured to register a further current measurement value at a point at which a return current associated with the current measurement value is assumed, wherein the local control device is configured to form a difference between the current measurement value and the further current measurement value end to switch off the one of the first and second semiconductor switches, when an amount of the difference is exceeded.

13. The direct current switch of claim 12, further comprising a comparator configured to detect a polarity of the current.

14. The direct current switch of claim 12, wherein each of the first and second semiconductor switches has $U_{CE}$ monitoring.

15. The direct current switch of claim 12, further comprising a protection element between one of the first and second terminals and one of the first and second semiconductor switches.

16. The direct current switch of claim 15, wherein the protection element is at least one of a switch-disconnector and a fuse.

17. The direct current switch of claim 12, further comprising a current measurement device and/or a voltage measurement device.

18. The direct current switch of claim 12, further comprising a superordinate controller configured to switch on and off the first and second semiconductor switches, said local control device including an interface to the superordinate controller.

19. A DC voltage system, comprising:
an energy source having a DC voltage;
an electric load having a DC voltage connection; and
a direct current switch connected to the energy source and the electric load, said direct current switch comprising first and second terminals, first and second semiconductor switches capable of being switched off and arranged between the first and second terminals to enable conduction of a current with a first polarity through the first semiconductor switch and conduction of the current with a second polarity that is opposite to the first polarity through the second semiconductor switch, and a local control device configured to switch off the current through the direct current switch as a function of a current measurement value by switching off one of the first and second semiconductor switches, and a current measurement device configured to register a further current measurement value at a point at which a return current associated with the current measurement value is assumed, wherein the local control device is configured to form a difference between the current measurement value and the further current measurement value and, to switch off the one of the first and second semiconductor switches, when an amount of the difference is exceeded.

* * * * *